United States Patent
Reznicek et al.

(10) Patent No.: US 11,355,553 B2
(45) Date of Patent: Jun. 7, 2022

(54) RESISTIVE RANDOM ACCESS MEMORY INTEGRATED UNDER A VERTICAL FIELD EFFECT TRANSISTOR

(71) Applicant: INTERNATIONAL BUSINESS MACHINES CORPORATION, Armonk, NY (US)

(72) Inventors: Alexander Reznicek, Troy, NY (US); Bahman Hekmatshoartabari, White Plains, NY (US); Choonghyun Lee, Rensselaer, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 16/704,245

(22) Filed: Dec. 5, 2019

(65) Prior Publication Data
US 2021/0175285 A1 Jun. 10, 2021

(51) Int. Cl.
*H01L 27/24* (2006.01)
*H01L 29/786* (2006.01)
(Continued)

(52) U.S. Cl.
CPC .... *H01L 27/2454* (2013.01); *H01L 29/66742* (2013.01); *H01L 29/78642* (2013.01);
(Continued)

(58) Field of Classification Search
CPC ........... H01L 27/2454; H01L 29/78642; H01L 29/66742; H01L 45/1233; H01L 45/16;
(Continued)

(56) References Cited

U.S. PATENT DOCUMENTS

| | | | |
|---|---|---|---|
| 6,610,548 B1 | 8/2003 | Ami | |
| 6,852,575 B2 | 2/2005 | Bojarczuk, Jr. | |

(Continued)

FOREIGN PATENT DOCUMENTS

| | | | | |
|---|---|---|---|---|
| WO | WO-2006013819 A1 * | 2/2006 | ......... | H01L 45/1233 |
| WO | WO 2006013819 A1 * | 2/2006 | ......... | H01L 45/1233 |
| WO | 20170582991 A1 | 4/2017 | | |

OTHER PUBLICATIONS

Mehonic et al., "Quantum Conductance in Silicon Oxide Resistive Memory Devices", Scientific Reports, 3 2708, DOI: 10 1038/srep02708, Published Sep. 19, 2013, 8 pages.
(Continued)

*Primary Examiner* — Shahed Ahmed
(74) *Attorney, Agent, or Firm* — L. Jeffrey Kelly (57) ABSTRACT

A semiconductor structure may include a vertical field effect transistor, the vertical field effect transistor may include a top source drain, a bottom source drain, and an epitaxial channel and a resistive random access memory below the vertical field effect transistor. The resistive random access memory may include an epitaxial oxide layer, a top electrode, and a bottom electrode. The top electrode, which may function as the bottom source drain of the vertical field effect transistor, may be in direct contact with the epitaxial channel of the vertical field effect transistor. The epitaxial oxide layer may separate the top electrode from the bottom electrode. The top source drain may be arranged between a dielectric material and the epitaxial channel. The dielectric material may be in direct contact with a top surface of the epitaxial channel. The epitaxial oxide layer may be composed of a rare earth oxide.

17 Claims, 8 Drawing Sheets

(51) Int. Cl.
*H01L 29/66* (2006.01)
*H01L 45/00* (2006.01)

(52) U.S. Cl.
CPC .......... *H01L 45/10* (2013.01); *H01L 45/1233* (2013.01); *H01L 45/16* (2013.01)

(58) Field of Classification Search
CPC ... H01L 45/10; H01L 45/1616; H01L 45/124; H01L 45/1273; H01L 45/08; H01L 45/147; H01L 45/146; H01L 29/7827; H01L 21/823487; H01L 21/823885; H01L 45/12–1253; H01L 45/1266–14; H01L 45/145–1691
See application file for complete search history.

(56) References Cited

U.S. PATENT DOCUMENTS

| | | | |
|---|---|---|---|
| 7,135,699 B1 | 11/2006 | Atanackovic | |
| 7,372,091 B2 | 5/2008 | Leslie | |
| 9,230,968 B2 | 1/2016 | Guha | |
| 9,525,064 B1 | 12/2016 | Balakrishnan | |
| 9,548,259 B2 | 1/2017 | Kuroki | |
| 9,704,860 B1 * | 7/2017 | Balakrishnan | H01L 21/823431 |
| 9,806,173 B2 | 10/2017 | Balakrishnan | |
| 10,056,379 B1 * | 8/2018 | Balakrishnan | H01L 29/78642 |
| 10,269,869 B1 * | 4/2019 | Ando | H01L 29/66439 |
| 10,297,749 B1 * | 5/2019 | Hashemi | H01L 45/1616 |
| 2017/0279043 A1 | 9/2017 | Apodaca | |
| 2019/0019809 A1 | 1/2019 | Lee | |
| 2019/0198571 A1 * | 6/2019 | Xu | H01L 45/1683 |

OTHER PUBLICATIONS

Chung et al., "Effect of Dopants on Epitaxial Growth of Silicon Nanowires", Nanomaterials and Nanotechnology, Open Access Article, 2014, pp. 1-6.

* cited by examiner

RESISTIVE RANDOM ACCESS MEMORY INTEGRATED UNDER A VERTICAL FIELD EFFECT TRANSISTOR

BACKGROUND

The present invention relates generally to a semiconductor structure and a method of forming the same. More particularly, the present invention relates to a semiconductor structure that includes a resistive random access memory (ReRAM) integrated with a vertical field effect transistor (VFET).

Many modern day electronic devices contain electronic memory. Electronic memory may be volatile memory or non-volatile memory. Non-volatile memory retains its stored data in the absence of power, whereas volatile memory loses its stored data when power is lost. Resistive random access memory (ReRAM or RRAM) is one promising candidate for the next generation of non-volatile memory due to its simple structure and its compatibility with complementary metal-oxide-semiconductor (CMOS) logic fabrication processes.

Resistive random access memory works by changing the resistance across a dielectric solid-state material. A typical ReRAM consists of a bottom electrode 106, a top electrode, and an oxide layer between the two electrodes.

SUMMARY

According to one embodiment of the present invention, a semiconductor structure is provided. The semiconductor structure may include a vertical field effect transistor, the vertical field effect transistor may include a top source drain, a bottom source drain, and an epitaxial channel and a resistive random access memory below the vertical field effect transistor. The resistive random access memory may include an epitaxial oxide layer, a top electrode, and a bottom electrode. The top electrode, which may function as the bottom source drain of the vertical field effect transistor, may be in direct contact with the epitaxial channel of the vertical field effect transistor. The epitaxial oxide layer may separate the top electrode from the bottom electrode. The top source drain may be arranged between a dielectric material and the epitaxial channel. The dielectric material may be in direct contact with a top surface of the epitaxial channel. The epitaxial oxide layer may be composed of a rare earth oxide. The rare earth oxide may have oxygen vacancies. The semiconductor structure may include a source drain contact contacting the top source drain, a gate contact contacting a metal gate material of the vertical field effect transistor, and a resistive random access memory contact contacting the bottom electrode.

According to another embodiment of the present invention, a semiconductor structure is provided. The semiconductor structure may include vertical field effect transistor, the vertical field effect transistor including a top source drain, a bottom source drain, and an epitaxial channel and a resistive random access memory below the vertical field effect transistor. The resistive random access memory may include a top electrode and a bottom electrode separated by an epitaxial oxide layer, wherein the top electrode, which functions as the bottom source drain of the vertical field effect transistor, is in direct contact with the epitaxial channel of the vertical field effect transistor, wherein the top electrode extends downward into the bottom electrode. The epitaxial oxide layer may separate the top electrode from the bottom electrode. The top source drain may be arranged between a dielectric material and the epitaxial channel. The dielectric material may be in direct contact with a top surface of the epitaxial channel. The epitaxial oxide layer may be composed of a rare oxide. The rare oxide may have oxygen vacancies. The semiconductor structure may include a source drain contact contacting the top source drain, a gate contact contacting a metal gate material of the vertical field effect transistor, and a resistive random access memory contact contacting the bottom electrode. The top electrode may be grown on top of the epitaxial oxide layer. The top electrode may be a single crystal silicon.

According to another embodiment of the present invention, a method is provided. The method may include forming a vertical field effect transistor, the vertical field effect transistor may include a top source drain, a bottom source drain, and an epitaxial channel and forming a resistive random access memory below the vertical field effect transistor. The resistive random access memory may include an epitaxial oxide layer, a top electrode, and a bottom electrode, wherein the top electrode may be in direct contact with the epitaxial channel of the vertical field effect transistor. The top electrode of the resistive random access memory may function as the bottom source drain of the vertical field effect transistor. The epitaxial oxide layer may be composed of a rare oxide. The rare oxide may have oxygen vacancies. The top electrode may have a tip region that contacts a faceted upper surface of the bottom electrode. The method may include forming a source drain contact contacting the top source drain, forming a gate contact contacting a metal gate material of the vertical field effect transistor, and forming a resistive random access memory contact contacting the bottom electrode.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to a semiconductor structure and a method of forming the same. More particularly, the present invention relates to a semiconductor structure that includes a resistive random access memory (ReRAM) integrated with a vertical field effect transistor (VFET).

ReRAM is a type of random-access computer memory that works by changing the resistance across a dielectric solid-state material. ReRAM is a promising technology for high-speed content addressable memory. Some applications of ReRAM may include high-speed search in computer networks, such as, for example, for routing MAC addresses.

Typically, a ReRAM may include a bottom electrode 106, a top electrode, and an oxide layer between the two electrodes. In an oxide ReRAM, electroforming of current conducting filament is needed. This process relies on randomness and thus the position of the filament of the oxide ReRAM is not well controlled. This results in a higher forming voltage as the ReRAM cell is scaled and higher device variability. As such, there exists a need to form a ReRAM cell that can be scaled.

Embodiments of the present invention propose a stacked oxide ReRAM vertical field effect transistor structure wherein the vertical effect transistor structure is stacked on top of the oxide ReRAM with a common drain connection. Embodiments of the present invention propose forming the oxide ReRAM in the reverse recessed epitaxy drain region under the VFET. More particularly, the top electrode of the oxide ReRAM also functions as a bottom source drain of the VFET. The reverse recessed epitaxy drain region is redefined to a pointed cone, enhancing the electric field at the tip of the cone. The VFET and the oxide ReRAM are connected in series to form a one-transistor-one-resistor (1T1R) structure.

FIGS. 1-17 illustrate exemplary semiconductor structure that includes a resistive random access memory (ReRAM) integrated with a vertical field effect transistor (VFET).

Figure 1:
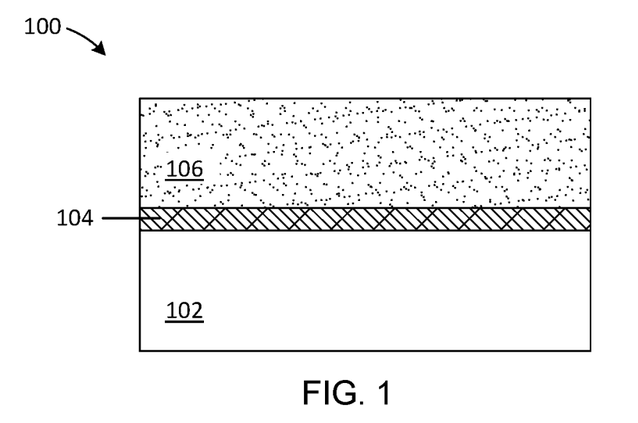
FIG. 1 is a cross section view illustrating a forming a counter doped layer and a bottom electrode 106 on a substrate according to an exemplary embodiment.

Referring now to FIG. 1, a structure 100 is shown, in accordance with an embodiment. The structure 100 may include a substrate 102, a counter-doped layer 104, and a bottom electrode 106. The substrate 102 may include one or more semiconductor materials. Non-limiting examples of suitable substrate 102 materials may include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. In an embodiment, the substrate 102 may include germanium. In one embodiment, the substrate 102 is a bulk semiconductor substrate. The term "bulk semiconductor substrate" denotes a substrate that is composed entirely of one or more semiconductor materials. In one example, the bulk semiconductor substrate is composed entirely of Si.

The counter-doped layer 104 is deposited onto the top surface of the substrate 102. The bottom electrode 106 is then arranged on the substrate 102 over the counter-doped layer 104. The bottom electrode 106 and the counter-doped layer 104 may be formed on the substrate 102 incorporating dopants into the substrate 102 or forming an epitaxial growth on the substrate 102. The bottom electrode 106 is heavily doped with a dopant, which may be a p-type dopant (e.g., boron or gallium) or an n-type dopant (e.g., phosphorus or arsenic).

The counter-doped layer 104 includes a dopant that is different/opposite the dopant in the bottom electrode 106.

For example, when the bottom electrode 106 includes a p-type dopant, the counter-doped layer 104 includes an n-type dopant, and when the bottom electrode 106 includes an n-type dopant, the counter-doped layer 104 includes a p-type dopant. The bottom electrode 106 is heavily doped, including a dopant concentration in a range from about 1019 to about 1022 atoms/cm3. The thickness of the counter-doped layer 104 may be in a range from about 5 to about 50 nm, or from about 10 to about 20 nm. The thickness of the bottom electrode 106 may be in a range from about 50 to about 250 nm, or from about 100 to about 200 nm. The counter-doped layer 104 acts as an insulator, insulating the bottom electrode 106 from the substrate 102 such that electrical current does not dissipate into the substrate 102.

Both the counter-doped layer 104 and the bottom electrode 106 may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

Figure 2:
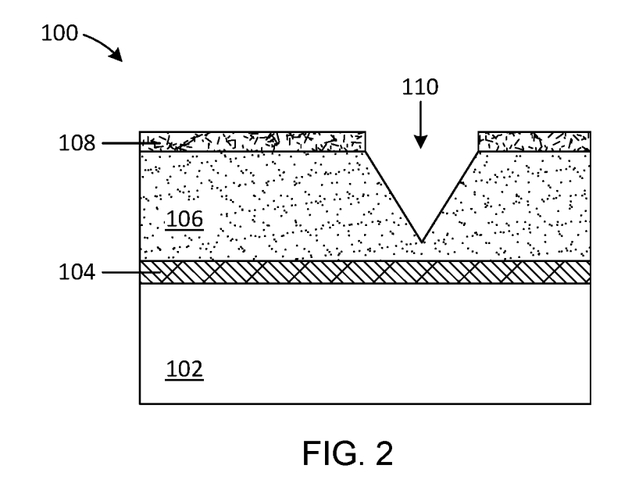
FIG. 2 is a cross section view illustrating etching a facetted recess into the bottom electrode 106 according to an exemplary embodiment.

Referring now to FIG. 2, the structure 100 with a mask 108 and a faceted recess 110 is shown, in accordance with an embodiment. The faceted recess 110 may be formed by first providing the mask 108 on the bottom electrode 106. The mask 108 may include a hard mask material such as, for example, silicon nitride. The mask 108 may be formed by depositing a blanket layer of the hard mask material, and thereafter patterning the blanket layer of the hard mask material. The patterning of the blanket layer of the hard mask material may include an etch, such as, for example, a reactive ion etch.

Once the mask 108 is etched to expose a portion of the bottom electrode 106, another etch, such as, for example, an anisotropic etch using potassium hydroxide may be used to form the faceted recess 110 in the exposed portion of the bottom electrode 106. The faceted recess 110 has a surface with a crystallographic orientation of <111>. In addition, the faceted recess 110 has faceted upper surfaces that form a tip region, with an ideal angle of 70.53 degree. The tip region is used for the subsequently formed ReRAM device. Only the exposed portion of the bottom electrode 106 is etched to form the faceted recess 110. The remaining bottom electrode 106 is not etched because it is protected by the mask 108.

Figure 3:
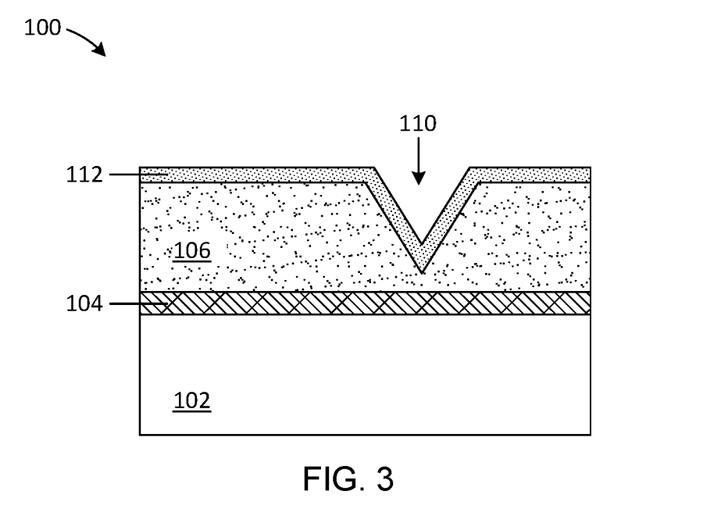
FIG. 3 is a cross section view illustrating growing an epitaxial oxide layer according to an exemplary embodiment.

Referring now to FIG. 3, the structure 100 with an epitaxial oxide layer 112 is shown, in accordance with an embodiment. Once the faceted recess 110 is formed, the mask 108 is removed from the structure 100. The mask 108 may be removed by utilizing any material removal process, such as, for example, chemical mechanical polishing. Once the mask 108 is removed, exposing the top surface of the bottom electrode 106, the epitaxial oxide layer 112 is grown along the top surface of the bottom electrode 106 and the sidewalls of the faceted recess 110. The terms "epitaxial growth and/or deposition" and "epitaxially formed and/or grown" mean the growth of a material on a deposition surface of a material, in which the material being grown has the same crystalline characteristics as the material of the deposition surface. In an epitaxial deposition process, the chemical reactants provided by the source gases are controlled and the system parameters are set so that the depositing atoms arrive at the deposition surface of the growth surface with sufficient energy to move around on the surface and orient themselves to the crystal arrangement of the atoms of the deposition surface. Therefore, an epitaxial material has the same crystalline characteristics as the deposition surface on which it is formed.

The epitaxial oxide layer 112 may be grown using epitaxial growth process apparatuses, such as, for example molecular beam epitaxy (MBE). Other method such as rapid thermal chemical vapor deposition (RTCVD), low-energy plasma deposition (LEPD), ultra-high vacuum chemical vapor deposition (UHVCVD), atmospheric pressure chemical vapor deposition (APCVD) may also be used to grow the epitaxial oxide layer 112. The temperature for epitaxial deposition typically ranges from 450° C. to 900° C. Although higher temperature typically results in faster deposition, the faster deposition may result in crystal defects and film cracking.

The epitaxial oxide layer 112 may be grown as a single crystalline structure allowing for the subsequent growth of a top electrode to be accomplished on top of the epitaxial oxide layer 112. In addition, the epitaxial oxide layer 112 may be made of rare earth oxides such as, for example, $La_{1-x}Y_xO_3$, x=0.33. Rare earth metals that can be used herein as a component of the epitaxial oxide layer 112 may include scandium, yttrium, a lanthanide (i.e., La, Ce, Pr, Nd, Pm, Sm, Eu, Gd, Tb, Dy, Ho, Er, Tm, Yb, and Lu), or any combination thereof.

In an embodiment, the epitaxial oxide layer 112 may be made of at least one rare earth metal with an oxide that is a binary compound. In another embodiment, the epitaxial oxide layer 112 may be made of at least one rare earth metal with an oxide that is a ternary compound. Examples of oxides of at least one rare earth metal that can be used for the epitaxial oxide layer 112 may include, but are not limited to, $(La_xY_{1-x})_2O_3$ wherein x is 0.33, $Gd_2O_3$, $Er_2O_3$, $Dy_2O_3$, $Ho_2O_3$, $Tm_2O_3$, $Lu_2O_3$ and $CeO_2$. In addition to $(La_xY_{1-x})_2O_3$, other ternary compounds having the formula $(RE^1_xRE^2_{1-x})_2O_3$ wherein $RE^1$ is a first rare earth metal and $RE^2$ is a second rare earth metal that differs from the first rare earth metal may be used. For example, the epitaxial oxide layer 112 may be made of the rare earth oxide having oxygen vacancies, such as, for example $La_{1-x}Y_xO_{2.8}$, x=0.33. In an embodiment, the epitaxial oxide layer 112 is both a filament forming material and a growth layer, allowing for the subsequent top electrode to be grown.

Figure 4:
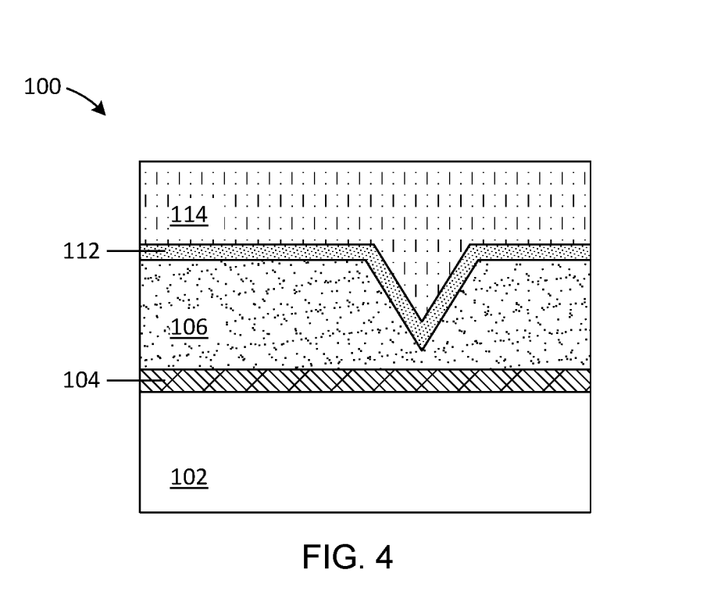
FIG. 4 is a cross section view illustrating forming a top electrode according to an exemplary embodiment.

Referring now to FIG. 4, the structure 100 with a top electrode 114 is shown, in accordance with an embodiment. The top electrode 114 is grown onto the top surface of the epitaxial oxide layer 112. The top electrode 114 may be a single crystal silicon. The top electrode 114 is epitaxially grown and in-situ doped. The top electrode 114 may be heavily doped with a dopant, which may be a p-type dopant (e.g., boron or gallium) or an n-type dopant (e.g., phosphorus or arsenic).

The top electrode 114, the epitaxial oxide layer 112, and the bottom electrode 106 collectively make up the ReRAM structure. Further, having the top electrode 114 extend downward into the bottom electrode 106 allows for the filament formation of the ReRAM to be concentrated at the tip due to the fact that electrical field is at its highest at the tip point. The top electrode 114 also functions as a bottom source drain of a VFET that will be formed in subsequent steps described herein with reference to FIGS. 5-17.

Figure 5:
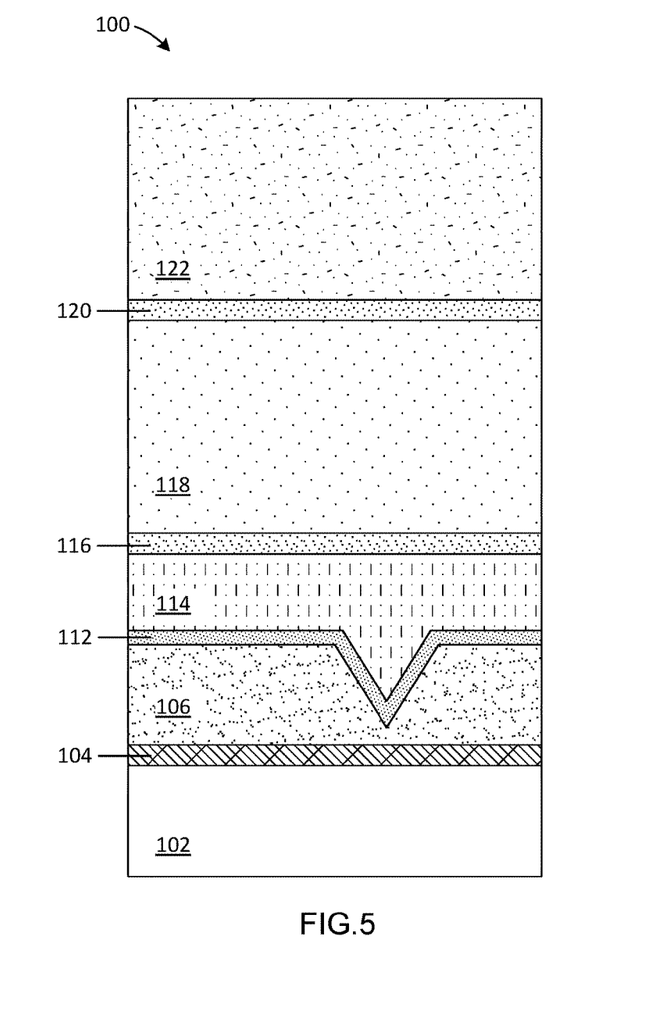
FIG. 5 is a cross section view illustrating depositing a bottom spacer, a dummy gate, a top spacer, and an oxide layer according to an exemplary embodiment.

Referring now to FIG. 5, the structure 100 with a first spacer 116, a dummy gate 118, a second spacer 120, and a dielectric capping layer 122 is shown, in accordance with an embodiment. The dummy gate 118 is disposed onto the top electrode 114 between the first spacer 116 and the second spacer 120. The first spacer 116 is deposited on the top electrode 114, the dummy gate 118 is deposited on the first spacer 116, and the second spacer 120 is deposited on the dummy gate 118.

The first spacer 116 and second spacer 120 may include an insulating material, such as, for example, silicon dioxide, silicon nitride, SiOCN, or SiBCN. Other non-limiting examples of materials for the first spacer 116 and the second spacer 120 may include dielectric oxides (e.g., silicon oxide), dielectric nitrides (e.g., silicon nitride), dielectric oxynitrides, or any combination thereof. The first spacer 116 and second spacer 120 materials are deposited by a deposition process, for example, chemical vapor deposition (CVD) or physical vapor deposition (PVD). The first spacer 116 and the second spacer 120 may each have a thickness of about 3 to about 15 nm, or of about 5 to about 10 nm.

The dummy gate 118 may include a sacrificial gate material, for example, amorphous silicon (aSi) or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial material forming the dummy gate 118 may have a thickness of about 8 nm to about 100 nm, or from about 10 nm to about 30 nm.

The dielectric capping layer 122 is deposited on the second spacer 120 over the dummy gate 118. The dielectric capping layer 122 may also be referred to as an oxide layer. Non-limiting examples of materials for the dielectric capping layer 122 may include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 122 may have a thickness in a range from about 30 nm to about 200 nm, or from about 50 nm to about 100 nm.

Figure 6:
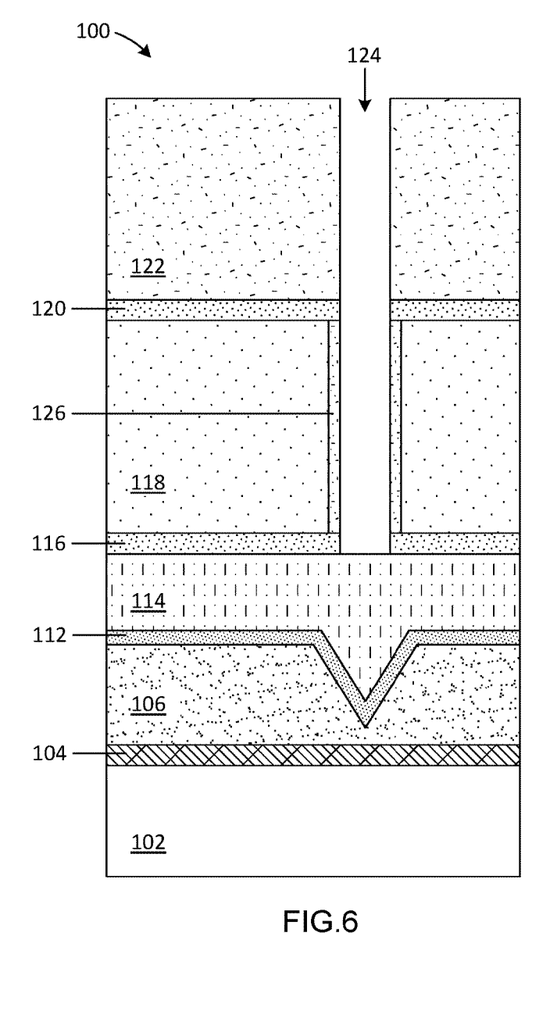
FIG. 6 is a cross section view illustrating forming a trench to expose the top electrode according to an exemplary embodiment.

Referring now to FIG. 6, the structure 100 with a trench 124 is shown, in accordance with an embodiment. The trench 124 undergoes a manufacturing process, described herein below, to form a vertical transistor. The trench 124 extends from a top surface of the dielectric capping layer 122 to the top electrode 114, exposing the top surface of the top electrode 114. The trench 124 is formed by performing an etch process that is selective to (will not substantially remove) the top electrode 114 material. The etch process may be, for example, a reactive ion etch.

Multiple etching processes may be performed to form the trench 124 within the structure 100. For example, a first etching process may be performed to remove a portion of the dielectric capping layer 122 selective to the material of the second spacer 120. A second etching process may then be performed to remove a portion of the second spacer 120, which underlies the portion of the trench 124 formed from the first etching process, selective to the material of the dummy gate 118. A third etching process may then be performed to remove a portion of the dummy gate 118, which underlies the portion of the trench 124 formed from the second etching process, selective to the material of the first spacer 116. A fourth etching process may then be performed to remove a portion of the first spacer 116, thereby exposing a top surface of the top electrode 114. The resulting trench 124 may extend through a top surface of the dielectric capping layer 122 down to a top surface of an exposed portion of the top electrode 114. The width of the trench 124 may be about 3 nm to about 20 nm, or about 5 nm to about 10 nm. The depth of the trench 124 may be about 50 nm to about 300 nm, or from about 100 nm to about 200 nm.

Once the trench 124 is formed, portions of the dummy gate 118 sidewalls are oxidized. The oxidation allows for a thin layer of oxide 126 to be formed along the sidewalls of the trench 124. The oxidation may be performed by a plasma oxidation process or other oxidation process that forms a thin oxide 126 layer. A portion of the first spacer 116 or the top electrode 114 also may be oxidized. However, any oxide formed in these regions may be removed before performing additional steps described herein with reference to FIGS. 7-17.

Figure 7:
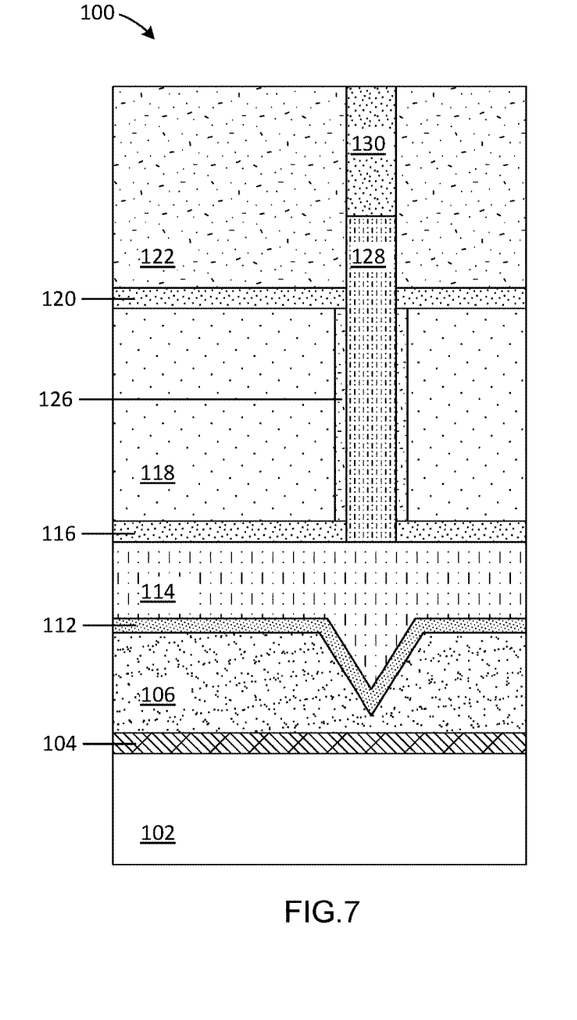
FIG. 7 is a cross section view illustrating forming an epitaxial channel with a dielectric layer according to an exemplary embodiment.

Referring now to FIG. 7, the structure 100 with an epitaxial channel 128 and a dielectric material 130, is shown in accordance with an embodiment. Once the portions of the dummy gate 118 sidewalls are oxidized, an epitaxial layer is grown on the top surface of the top electrode 114 to form the epitaxial channel 128. The epitaxial growth may include an epitaxial semiconductor material, and the epitaxial growth and/or deposition processes may be selective to forming on semiconductor surface, and do not deposit material on other surfaces, such as the oxide 126, the first spacer 116 or the second spacer 120.

The epitaxial channel 128 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The sources for the epitaxial channel material may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

During the growth process, the epitaxial growth in the epitaxial channel 128 may extend over the dielectric capping layer 122 (not illustrated). A planarization process, such as, for example, a chemical mechanical polishing (CMP) process, may be used to remove excess epitaxial growth over the dielectric capping layer 122. In addition, the epitaxial channel 128 may be partially recessed and then back filled with the dielectric material 130. The epitaxial channel 128 may be partially recessed to a level that is still within the dielectric capping layer 122 but above the second spacer 120. The epitaxial channel 128 may be recessed by etching, for example, by a reactive ion etch or a wet etch process.

The opening formed over the recessed epitaxial channel 128 is filled with a dielectric material. The dielectric material 130 may be a dielectric oxide (e.g., silicon oxide), a dielectric nitride (e.g., silicon nitride), a dielectric oxynitride, or any combination thereof. The dielectric material 130 is deposited by a deposition process, for example, chemical vapor deposition (CVD) or physical vapor deposition (PVD). After deposition, the dielectric material 130 is planarized, by for example, CMP. The dielectric material 130 is in direct contact with a top surface of the epitaxial channel 128, forming a dielectric cap over the epitaxial channel 128.

Figure 8:
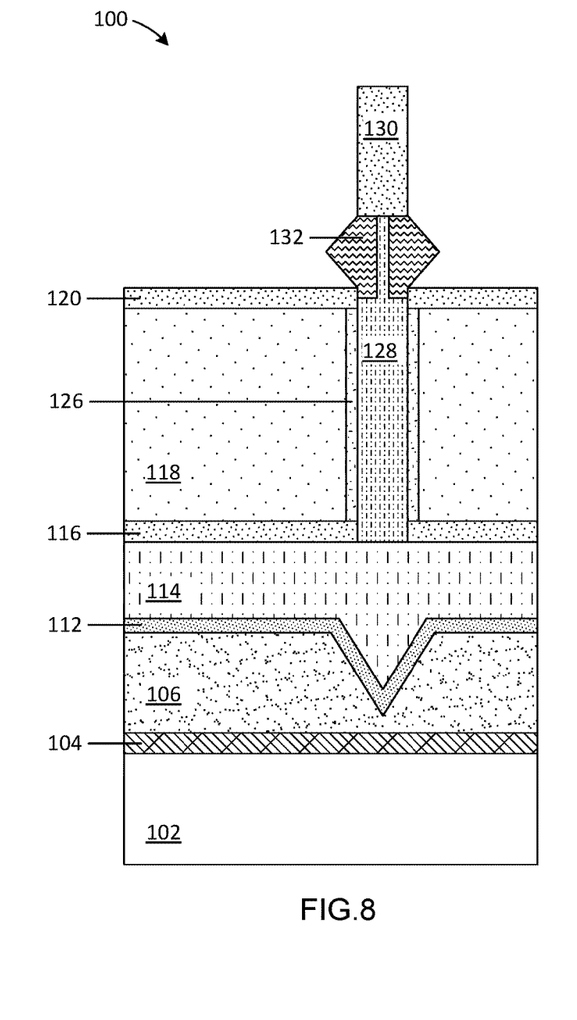
FIG. 8 is a cross section view illustrating a top source drain on the epitaxial channel according to an exemplary embodiment.

Referring now to FIG. 8, the structure 100 with a top source drain 132 is show, in accordance with an embodiment. Substantially all of the dielectric capping layer 122 is removed, thereby exposing the top surface of the second spacer 120. The dielectric capping layer 122 may be etched using a process that is selective to (will not substantially remove) the second spacer 120. Once the dielectric capping layer 122 is removed, the top source drain 132 is epitaxially grown from an exposed sidewall of the epitaxial channel 128. The top source drain 132 is arranged between the dielectric material 130 and the epitaxial channel 128. The top source drain 132 is also arranged between the dielectric material 130 and the dummy gate 118. A portion of the epitaxial channel 128 over the second spacer 120 may be recessed along sidewalls before forming the top source drain 132. The top source drain 132 is the facetted epitaxy source drain region of the vertical transistor. The faceted top source drain 132 grows in a shape of a pointed cone, wherein the points of the top source drain 132 extend horizontally away from the epitaxial channel 128. The pointed cone shape of the top source drain 132 enhances the electric field at the tip of the cone.

Figure 9:
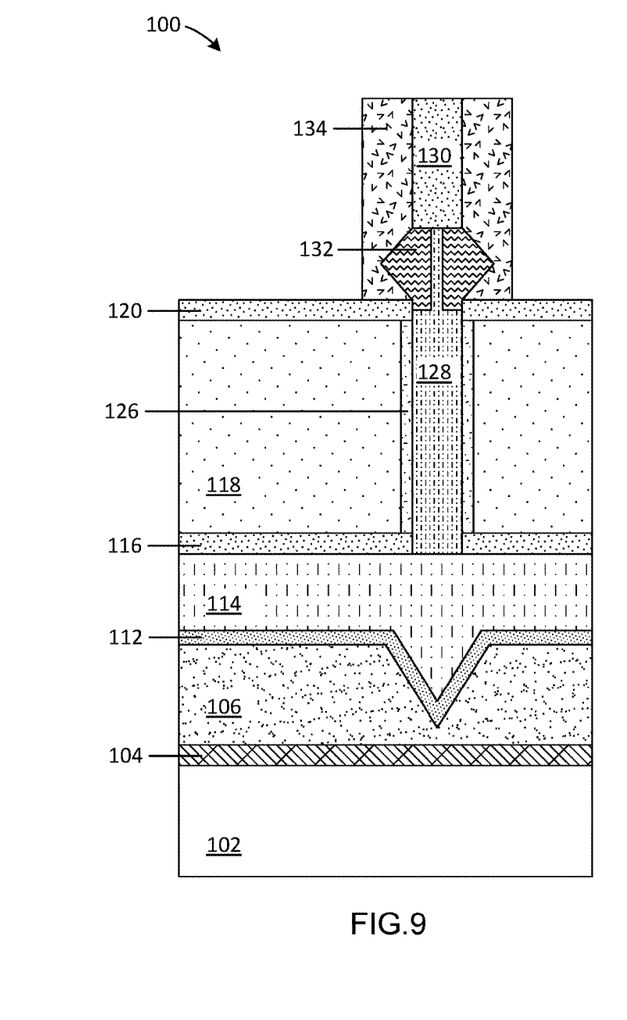
FIG. 9 is a cross section view illustrating depositing a spacer on the top source drain according to an exemplary embodiment.

Referring now to FIG. 9, the structure 100 with a third spacer 134, is shown in accordance with an embodiment. The third spacer 134 is deposited on the top source drain 132. The third spacer 134 protects the top source drain 132. The third spacer 134 is also disposed on a sidewall of the dielectric material 130. The third spacer 134 may include an insulating material, for example, dielectric oxides (e.g., silicon oxide), dielectric nitrides (e.g., silicon nitride), dielectric oxynitrides, or any combination thereof. The third spacer 134 material is deposited by a deposition process, for example, chemical vapor deposition (CVD) or physical vapor deposition (PVD). The spacer material may be etched by a dry etch process, for example, a ME process, such that it covers the top source drain 132 and is removed from a surface of the dielectric material 130 and the second spacer 120.

Figure 10:
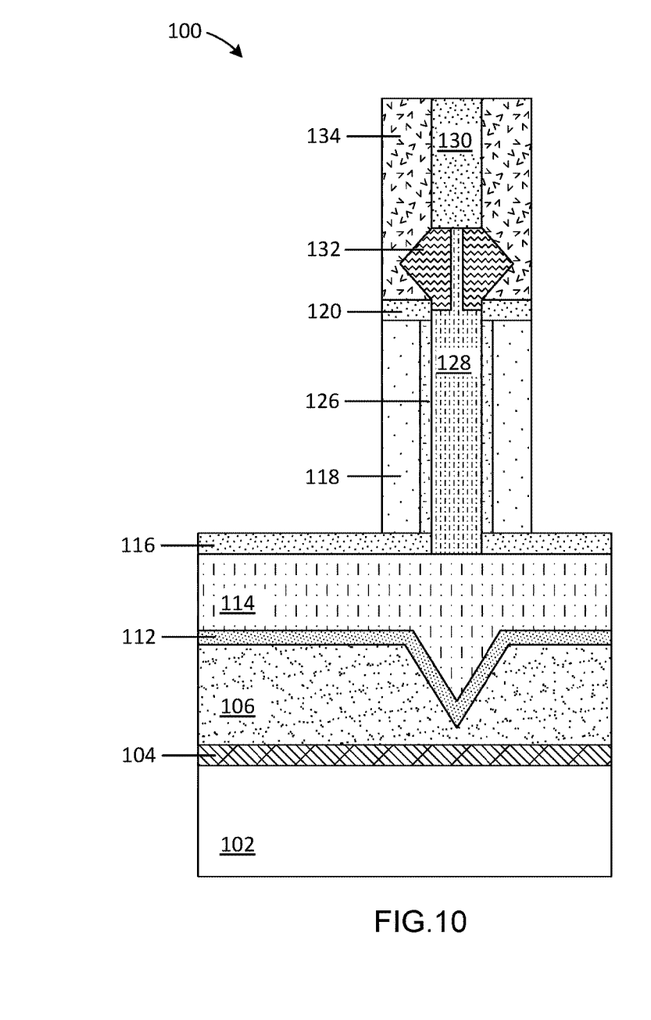
FIG. 10 is a cross section view illustrating recessing portions of the dummy gate to expose the first spacer according to an exemplary embodiment.

Referring now to FIG. 10, the structure 100 with portions of the second spacer 120 and the dummy gate 118 removed, is shown in accordance with an embodiment. Once the third spacer 134 is deposited, portions of the second spacer 120 and the dummy gate 118 are removed. The second spacer 120 and the dummy gate 118 are recessed to remove portions that extend horizontally beyond the third spacer 134 material. An etch process that is selective to (will not substantially remove) the first spacer 116 is performed. The etch process may be a dry etch process, such as an ME process.

Figure 11:
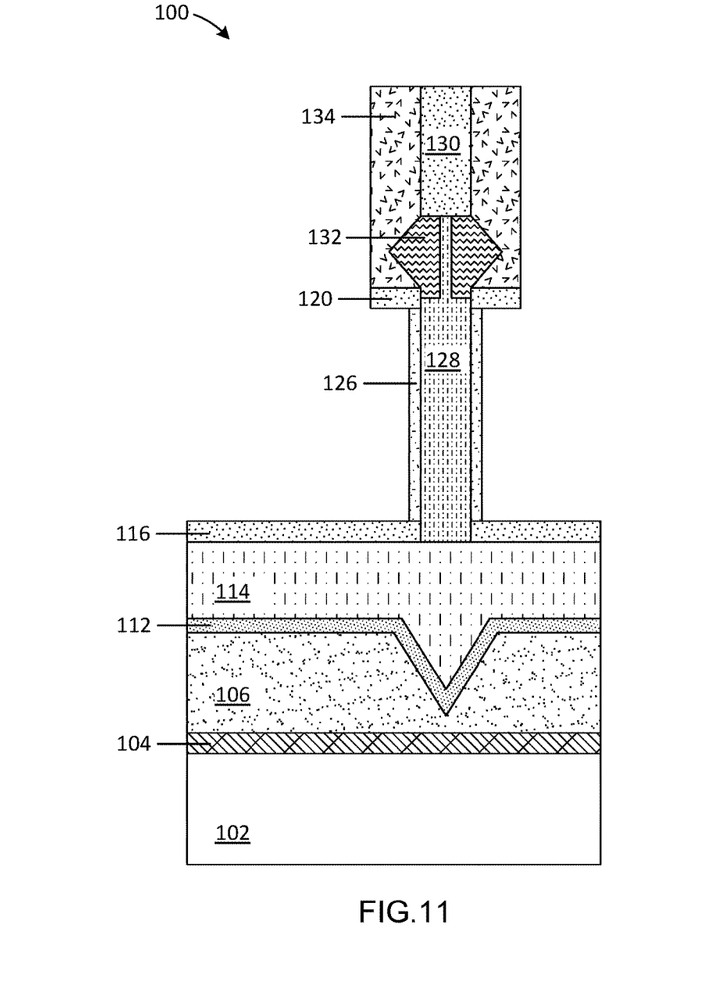
FIG. 11 is a cross section view illustrating removing the remaining portion of the dummy gate according to an exemplary embodiment.

Referring now to FIG. 11, the structure 100 with the remaining dummy gate 118 removed, is shown in accordance with an embodiment. Removing the remaining dummy gate 118 beneath the third spacer 134 exposes the oxide 126. The dummy gate 118 may be removed by a wet etch process, for example, a process that includes hot ammonia.

Figure 12:
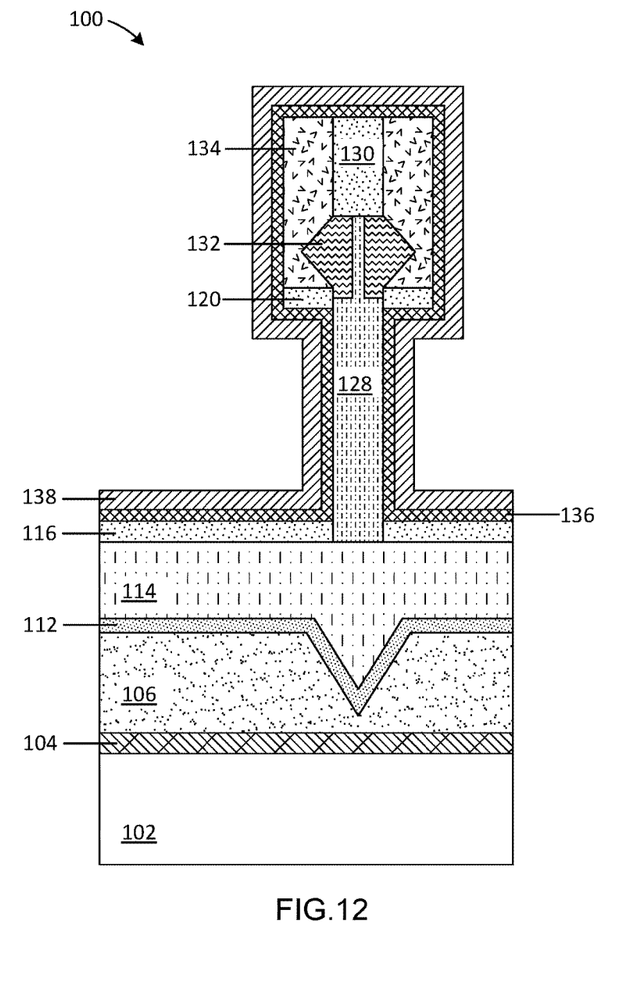
FIG. 12 is a cross section view illustrating depositing a gate dielectric material and a work function metal according to an exemplary embodiment.

Referring now to FIG. 12, the structure 100 with a gate dielectric material 136 and a work function metal 138 is shown, in accordance with an embodiment. Before the gate dielectric material 136 is deposited, the remaining portions of the oxide 126 are removed such that the sidewalls of the epitaxial channel 128 are exposed. The gate dielectric material 136 is then conformally deposited along the top surface of the structure 100. The work function metal 138 is then conformally deposited onto the top portions of the gate dielectric material 136. The gate dielectric material 136 and the work function metal 138 form a portion of the gate stack that replaces the dummy gate 118. The gate dielectric material 136 and the work function metal 138 are disposed on the first spacer 116, the epitaxial channel 128, the third spacer 134, and the remaining portions of the second spacer 120 beneath the top source drain 132.

The gate dielectric material 136 can be a dielectric material having a dielectric constant greater than 3.9, 7.0, or 10.0. Non-limiting examples of suitable materials for the gate dielectric material 136 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material 136 separates the epitaxial channel 128 from the work function metal 138, reducing the leakage current effect while increasing the capacitance of the work function metal 138. The gate dielectric material 136 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material 136 may vary depending on the deposition process as well as the composition and number of high-k dielectric materials used.

The work function metal 138 may be disposed over the gate dielectric material 136. The type of work function metal 138 depends on the type of a transistor. Non-limiting examples of suitable work function metal 138 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal 138 may be deposited by a suitable deposition process, for example, CVD, PECVD, PVD, plating, thermal or e-beam evaporation, and sputtering.

Figure 13:
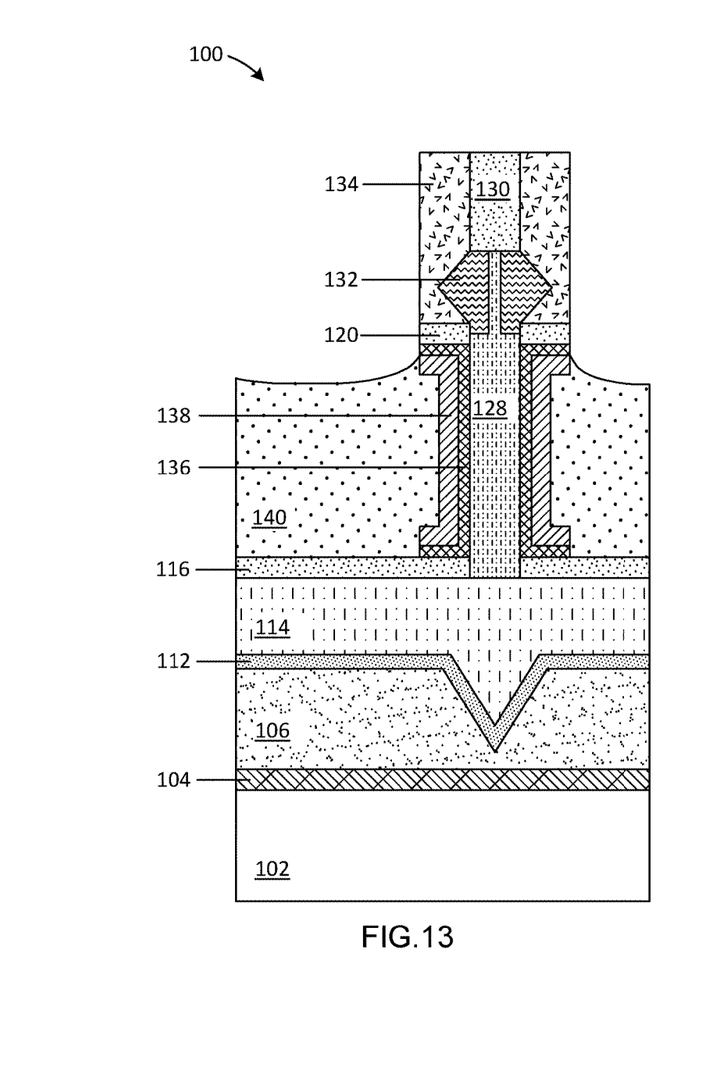
FIG. 13 is a cross section view illustrating partially recessing a metal gate material according to an exemplary embodiment.

Referring now to FIG. 13, the structure 100 with a metal gate material 140 partially recessed is shown, in accordance with an embodiment. The structure 100 is first filled with the metal gate material 140 such that top portions of the metal gate material 140 and top portions of the dielectric material 130 and the third spacer 134 are substantially flush. The metal gate material 140 is deposited over the gate dielectric material 136 and work function metal 138. The metal gate material 140, the work function metal 138, and the gate dielectric material 136 may be collectively referred to as a gate stack. Non-limiting examples of the metal gate material 140 may include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

The metal gate material 140 is then partially recessed by an etch process, for example, a reactive ion etch process to expose portions of the gate dielectric material 136 and the work function metal 138. After which, an anisotropic etch, such as, for example a RIE process, may be performed to recess the gate dielectric material 136 and the work function metal 138 down to the level of the metal gate material 140.

Figure 14:
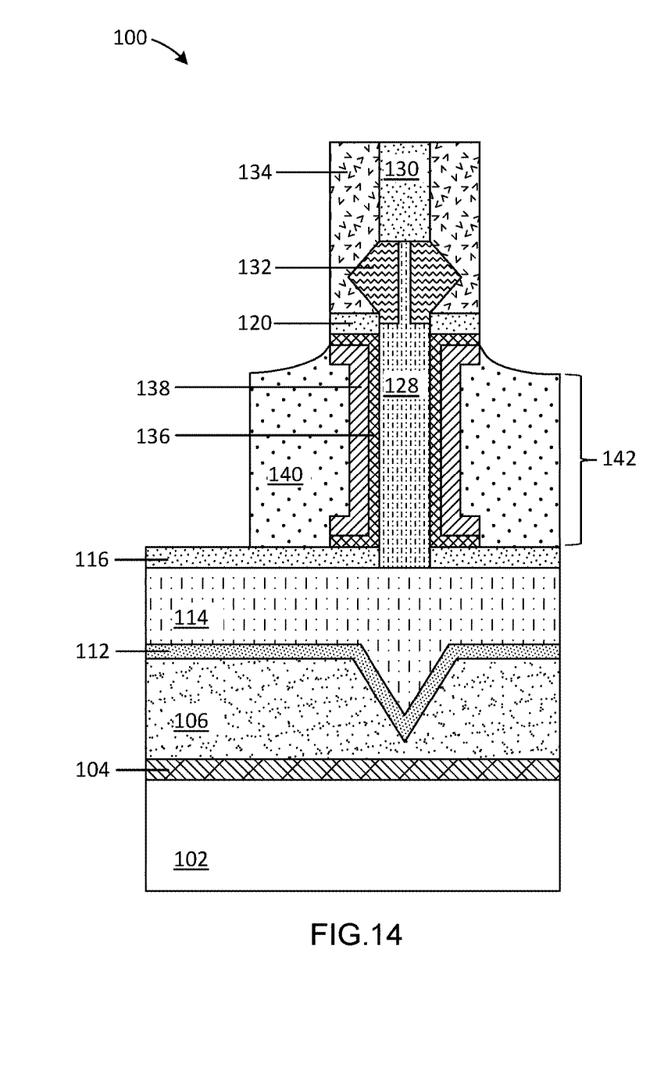
FIG. 14 is a cross section view illustrating performing gate lithography and etching according to an exemplary embodiment.

Referring now to FIG. 14, the structure 100 with a portion of the metal gate material 140 removed, is shown in accordance with an embodiment. A mask may be disposed on the metal gate material 140 and subsequently patterned. The pattern is transferred into the metal gate material 140 to remove a portion of the metal gate material 140 and define a gate 142. In addition, the gate dielectric material 136 and work function metal 138 are also etched during this step. A combination of RIE processes may be performed. A portion of the first spacer 116 is arranged between the gate stack of the gate 142 and the top electrode 114.

Figure 15:
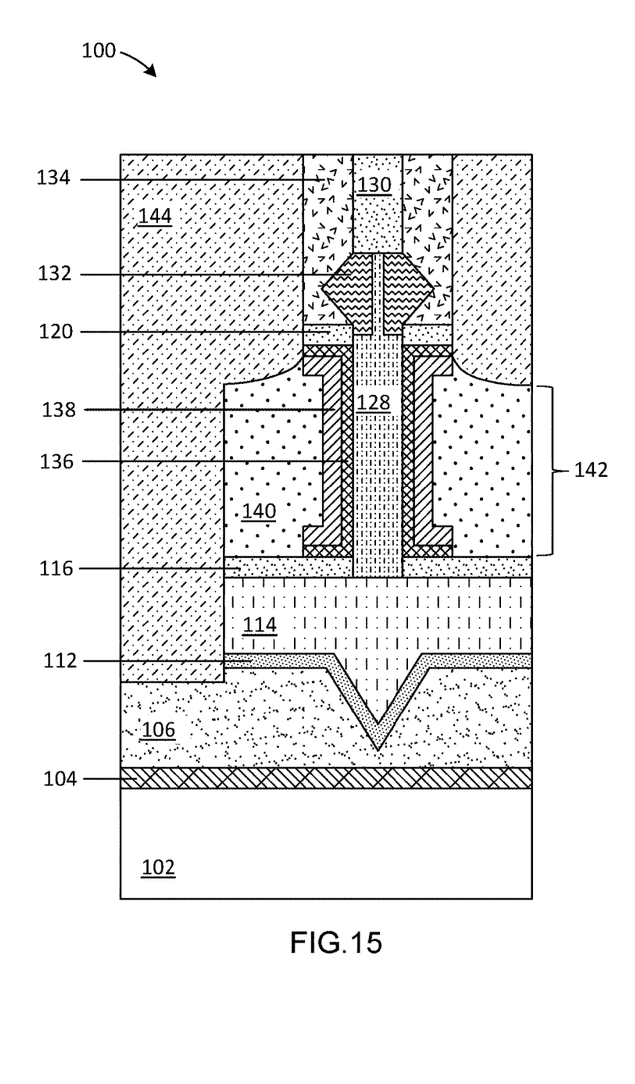
FIG. 15 is a cross section view illustrating depositing an interlayer dielectric according to an exemplary embodiment.

Referring now to FIG. 15, the structure 100 with an interlayer dielectric (ILD) 144 is shown, in accordance with an embodiment. The structure 100 undergoes an etch process where a portion of the first spacer 116, a portion of the top electrode 114, and a portion of the epitaxial oxide layer 112 are removed to expose a top surface of the bottom electrode 106. A mask may first be disposed on the exposed top surface of the first spacer 116 and subsequently patterned. The pattern is transferred into the first spacer 116 to remove a portion of the first spacer 116 to expose a top surface of the top electrode 114. The same process may be subsequently performed to remove a portion of the top electrode 114, a portion of the epitaxial oxide layer 112 to expose the top surface of the bottom electrode 106. The exposed portion of the bottom electrode 106 may be subsequently used to form contacts.

Once a portion of the top surface of the bottom electrode 106 is exposed, the ILD 144 is deposited such that top surface of the ILD 144 is substantially flush with the top surfaces of the dielectric material 130 and the third spacer 134. The ILD 144 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 144 is deposited by a deposition process, including, but not limited to CVD, PVD, plasma enhanced CVD, atomic layer deposition (ALD), evaporation, chemical solution deposition, or like processes. The resultant structure 100 includes a vertical transistor positioned on top of a ReRAM structure.

Figure 16:
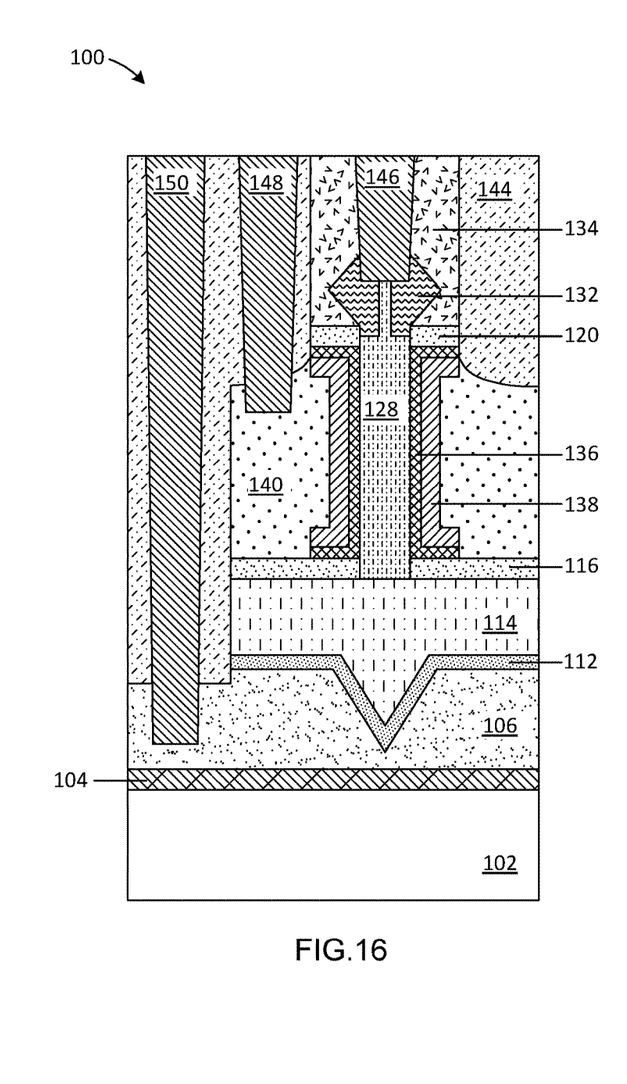
FIG. 16 is a cross section view illustrating forming contacts according to an exemplary embodiment.

Referring now to FIG. 16, the structure 100 with a source drain contact 146, a gate contact 148, and a ReRAM contact 150 is shown, in accordance with an embodiment. The source drain contact 146 extends through the dielectric material to the top source drain 132 and is formed within a trench. To remove the dielectric material and form the source drain trench, a resist, such as a photoresist, may be deposited and patterned. An etch process, such as a RIE, may be performed using the patterned resist as an etch mask to remove the dielectric material until the top source drain 132 is exposed. The source drain trench is filled with a conductive material or a combination of conductive materials to form the source drain contact 146. The conductive material filling may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 144.

The gate contact 148 extends from the top surface of the ILD 144 to the metal gate material 140. The gate contact 148 is formed by patterning a trench in the ILD 144. To remove the ILD 144 and form the gate contact trench, a resist, such as a photoresist, may be deposited and patterned. An etch process, such as a RIE, may be performed using the patterned resist as an etch mask to remove the ILD 144 until the metal gate material 140 is exposed. The gate contact trench is filled with a conductive material or a combination of conductive materials to form the gate contact 148. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 144.

The ReRAM contact 150 extends from the top surface of the ILD 144 to the bottom electrode 106. The ReRAM contact 150 is formed by patterning a trench in the ILD 144. To remove the ILD 144 and form the ReRAM contact trench, a resist, such as a photoresist, may be deposited and patterned. An etch process, such as a RIE, may be performed using the patterned resist as an etch mask to remove the ILD 144 until the bottom electrode 106 is exposed. The ReRAM contact trench is filled with a conductive material or a combination of conductive materials to form the ReRAM contact 150. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 144.

The resultant structure 100, as illustrated in FIG. 16, includes a vertical field effect transistor (VFET) and the ReRAM structure located below the VFET. The ReRAM structure includes the bottom electrode 106, the epitaxial oxide layer 112, and the top electrode 114. The ReRAM structure has a tip region defined by a pointed cone of the top electrode 114 and the epitaxial oxide layer 112. The tip region of the ReRAM enhances the electroforming of a current conducting filament of the ReRAM. Thus, the randomness of electroforming of the current conducting filament is reduced in the ReRAM structure of the present invention.

Having the ReRAM integrated with the bottom source drain of the VFET is more advantageous than having the ReRAM integrated with the top source drain of the VFET. When the ReRAM is integrated with the top source drain of the VFET, it creates variation or failure of the ReRAM operation due to the surface roughness and defects of the top source drain diamond shape. In addition, the VFET may itself experience performance degradation if the top source drain shape is not diamond shaped. By integrating the ReRAM with the bottom source drain of the VFET, the shape of the top source drain of the VFET does not affect the operation of the ReRAM. Further, having the bottom source drain redefined to a pointed cone enhances the electric field of the ReRAM at the tip. In addition, having the VFET integrated with the ReRAM structure saves space, allowing for fabrication of more VFETs and ReRAMs on the same footprint.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
    a vertical field effect transistor, the vertical field effect transistor comprising a top source drain, a bottom source drain, and an epitaxial channel; and
    a resistive random access memory below the vertical field effect transistor, the resistive random access memory comprising an epitaxial oxide layer, a top electrode, and a bottom electrode, wherein the top electrode is the bottom source drain of the vertical field effect transistor and is in direct contact with the epitaxial channel of the vertical field effect transistor, wherein the top electrode extends downward into the bottom electrode.

2. The semiconductor structure of claim 1, wherein the top source drain is arranged between a dielectric material and the epitaxial channel, the dielectric material is in direct contact with a top surface of the epitaxial channel.

3. The semiconductor structure of claim 1, wherein the epitaxial oxide layer is composed of a rare earth oxide.

4. The semiconductor structure of claim 1, wherein the epitaxial oxide layer is composed of a rare earth oxide, the rare earth oxide having oxygen vacancies.

5. The semiconductor structure of claim 1, further comprising:
    a source drain contact contacting the top source drain;
    a gate contact contacting a metal gate material of the vertical field effect transistor; and
    a resistive random access memory contact contacting the bottom electrode.

6. A semiconductor structure comprising:
    a vertical field effect transistor, the vertical field effect transistor comprising a top source drain, a bottom source drain, and an epitaxial channel; and
    a resistive random access memory below the vertical field effect transistor, the resistive random access memory comprising a top electrode and a bottom electrode separated by an epitaxial oxide layer, wherein the top electrode is the bottom source drain of the vertical field effect transistor is in direct contact with the epitaxial channel of the vertical field effect transistor, wherein the top electrode extends downward into the bottom electrode.

7. The semiconductor structure of claim 6, wherein the top source drain is arranged between a dielectric material and the epitaxial channel, the dielectric material is in direct contact with a top surface of the epitaxial channel.

8. The semiconductor structure of claim 6, wherein the epitaxial oxide layer is composed of a rare oxide.

9. The semiconductor structure of claim 6, wherein the epitaxial oxide layer is composed of a rare oxide, the rare oxide having oxygen vacancies.

10. The semiconductor structure of claim 6, further comprising:
    a source drain contact contacting the top source drain;
    a gate contact contacting a metal gate material of the vertical field effect transistor; and
    a resistive random access memory contact contacting the bottom electrode.

11. The semiconductor structure of claim 6, wherein the top electrode is grown on top of the epitaxial oxide layer, the top electrode is a single crystal silicon.

12. A semiconductor structure comprising:
    a vertical field effect transistor, the vertical field effect transistor comprising a top source drain, a bottom source drain, and an epitaxial channel; and
    a resistive random access memory below the vertical field effect transistor, the resistive random access memory comprising an epitaxial oxide layer, a top electrode, and a bottom electrode, wherein the top electrode is in direct contact with the epitaxial channel of the vertical field effect transistor, wherein a portion of the top electrode immediately below the epitaxial channel extends downward into the bottom electrode.

13. The semiconductor structure of claim 12, wherein the top source drain is arranged between a dielectric material and the epitaxial channel, the dielectric material is in direct contact with a top surface of the epitaxial channel.

14. The semiconductor structure of claim 12, wherein the epitaxial oxide layer is composed of a rare oxide.

15. The semiconductor structure of claim 12, wherein the epitaxial oxide layer is composed of a rare oxide, the rare oxide having oxygen vacancies.

16. The semiconductor structure of claim 12, further comprising:
    a source drain contact contacting the top source drain;
    a gate contact contacting a metal gate material of the vertical field effect transistor; and
    a resistive random access memory contact contacting the bottom electrode.

17. The semiconductor structure of claim 12, wherein the top electrode is grown on top of the epitaxial oxide layer, the top electrode is a single crystal silicon.

* * * * *